(12) United States Patent
Kim et al.

(10) Patent No.: US 9,224,830 B2
(45) Date of Patent: Dec. 29, 2015

(54) TRANSISTOR AND METHOD OF FABRICATING THE SAME

(71) Applicant: Electronics and Telecommunications Research Institute, Daejeon (KR)

(72) Inventors: Seong-Il Kim, Daejeon (KR); Jong-Won Lim, Daejeon (KR); Dong Min Kang, Daejeon (KR); Sang-Heung Lee, Daejeon (KR); Hyung Sup Yoon, Daejeon (KR); Chull Won Ju, Daejeon (KR); Byoung-Gue Min, Daejeon (KR); Jongmin Lee, Daejeon (KR); Jae Kyoung Mun, Daejeon (KR); Eun Soo Nam, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 66 days.

(21) Appl. No.: 13/914,713

(22) Filed: Jun. 11, 2013

(65) Prior Publication Data

US 2014/0167175 A1  Jun. 19, 2014

(30) Foreign Application Priority Data

Dec. 14, 2012 (KR) .................. 10-2012-0146836

(51) Int. Cl.
| *H01L 29/812* | (2006.01) |
| *H01L 29/66* | (2006.01) |
| *H01L 29/40* | (2006.01) |
| *H01L 29/41* | (2006.01) |
| *H01L 29/423* | (2006.01) |
| *H01L 29/778* | (2006.01) |
| *H01L 29/16* | (2006.01) |
| *H01L 29/20* | (2006.01) |

(52) U.S. Cl.
CPC ...... *H01L 29/66477* (2013.01); *H01L 29/1608* (2013.01); *H01L 29/2003* (2013.01); *H01L 29/40* (2013.01); *H01L 29/401* (2013.01); *H01L 29/402* (2013.01); *H01L 29/41* (2013.01); *H01L 29/42312* (2013.01); *H01L 29/42316* (2013.01); *H01L 29/42376* (2013.01); *H01L 29/66462* (2013.01); *H01L 29/7787* (2013.01); *H01L 29/812* (2013.01)

(58) Field of Classification Search
CPC ....... H01L 29/40; H01L 29/401; H01L 29/41; H01L 29/42312; H01L 29/42316; H01L 29/66462; H01L 2029/42312; H01L 2029/42316; H01L 29/812
See application file for complete search history.

(56) References Cited

U.S. PATENT DOCUMENTS

| 6,204,102 | B1 * | 3/2001 | Yoon et al. ................... 438/182 |
| 6,284,613 | B1 * | 9/2001 | Subrahmanyam et al. ... 438/307 |
| 7,141,464 | B2 | 11/2006 | Park et al. |
| 2009/0146182 | A1 * | 6/2009 | Hikita et al. .................. 257/190 |
| 2010/0140674 | A1 * | 6/2010 | Luo et al. ...................... 257/288 |

FOREIGN PATENT DOCUMENTS

KR  10-0348902 B1  8/2002

* cited by examiner

*Primary Examiner* — Fei Fei Yeung Lopez
(74) *Attorney, Agent, or Firm* — Rabin & Berdo, P.C.

(57) ABSTRACT

A field effect transistor is provided. The transistor may include a source electrode and a drain electrode provided spaced apart from each other on a substrate and a '+'-shaped gate electrode provided on a portion of the substrate located between the source and drain electrodes.

18 Claims, 7 Drawing Sheets

TRANSISTOR AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0146836, filed on Dec. 14, 2012, in the Korean Intellectual Property Office, the entire contents of which are hereby incorporated by reference.

BACKGROUND OF THE INVENTION

Example embodiments of the inventive concept relate to a transistor and a method of fabricating the same, and in particular, to a field effect transistor and a method of fabricating the same.

With the development of information technology (IT), there is an increasing demand for semiconductor devices with higher density, higher speed, higher voltage, and higher current density. Especially, a high electron mobility transistor (HEMT), which is usually a gallium nitride (GaN) device, is widely studied as a high speed, high voltage, and high current density device.

Generally, a reduction of a gate length makes it possible to increase a speed of a semiconductor device. However, the reduction of the gate length may result in deterioration in electric resistance and high frequency characteristics of the device. Further, an increase in integration density of the semiconductor device may lead to reduction of gate-to-drain distance and breakdown voltage. To improve a power density property of the semiconductor device, the gate electrode should be configured to have an increased width, but the increase of gate width may result in a collapse of the gate electrode.

To overcome this problem, the gate electrode is configured to include a narrow leg portion and a wide head portion. For example, the gate electrode is formed to have a 'T'-, 'Y'- or mushroom-shaped section. Alternatively, the transistor is configured to include a Γ-shaped gate and a field plate capable of increasing a breakdown voltage of the device. In the Γ-shaped gate, the gate leg portion is formed to have a small width and the gate head portion is formed to be elongated toward a specific direction. Since the head portion of the Γ-shaped gate is wider than the leg portion, it is possible to decrease a total resistance of the gate electrode and to form a depletion region between the head portion and the drain electrode. As a result, a breakdown voltage between the gate and drain electrodes can be increased.

Conventionally, a photoresist layer is formed to have a double- or triple-layered structure, and such a difference in sensitivity between the layers of the photoresist layer is used to form the T-shaped or Γ-shaped gate electrode with a wide head portion and a narrow leg portion. In this conventional gate-forming method, an E-Beam lithography process is used to meet a reduced design rule of the device.

In the case of the Γ-shaped gate, since the wide head portion is provided on the narrow leg portion, the gate may be structurally unstable. Further, the head portion may be asymmetrically provided on the leg portion, and in this case, the semiconductor device may suffer from reliability aggravated by its fabrication process or other factors. For example, the gate may be broken or collapsed by unstable weight distribution or structural instability of the head portion.

SUMMARY

Example embodiments of the inventive concept provide a field effect transistor with a stable gate electrode structure and an improved high frequency property.

Other example embodiments of the inventive concept provide a method of fabricating a field effect transistor with a stable gate electrode structure and an improved high frequency property.

According to example embodiments of the inventive concepts, a field effect transistor may include a source electrode and a drain electrode provided spaced apart from each other on a substrate, and a '+'-shaped gate electrode provided on a portion of the substrate located between the source and drain electrodes.

In example embodiments, the '+'-shaped gate electrode may include a T-shaped gate electrode portion, and an additional gate electrode portion provided on the T-shaped gate electrode portion.

In example embodiments, the additional gate electrode portion may be provided on a head portion of the T-shaped gate electrode portion in such a way that it is overlapped with a leg portion of the T-shaped gate electrode portion in plan view, and the additional gate electrode portion has a width that is greater than that of the leg portion of the T-shaped gate electrode portion and is smaller than that of the head portion of the T-shaped gate electrode portion.

In example embodiments, the additional gate electrode portion has a triangular or rectangular section.

In example embodiments, the additional gate electrode portion may include at least one of nickel, gold, platinum, titanium, chromium, titanium/tungsten alloy, or platinum silicide.

In example embodiments, the '+'-shaped gate electrode may include a Γ-shaped gate electrode portion, a first additional gate electrode portion provided on the Γ-shaped gate electrode portion, and a second additional gate electrode portion covering the first additional gate electrode portion and the Γ-shaped gate electrode portion.

In example embodiments, the first additional gate electrode portion may be provided on a head portion of the Γ-shaped gate electrode portion in such a way that it is overlapped with a leg portion of the Γ-shaped gate electrode portion in plan view, and the first additional gate electrode portion has a width that is greater than that of the leg portion of the Γ-shaped gate electrode portion and is smaller than that of the head portion of the Γ-shaped gate electrode portion.

In example embodiments, the first additional gate electrode portion has a triangular or rectangular section.

In example embodiments, the second additional gate electrode portion extends from a top surface of the first additional gate electrode portion toward a wider protrusion of the head portion of the Γ-shaped gate electrode portion.

In example embodiments, each of the first and second additional gate electrode portions may include at least one of nickel, gold, platinum, titanium, chromium, titanium/tungsten alloy, or platinum silicide.

According to example embodiments of the inventive concepts, a method of fabricating a field effect transistor may include forming a source electrode and a drain electrode on a substrate to be spaced apart from each other, and forming a '+'-shaped gate electrode on a portion of the substrate located between the source and drain electrodes.

In example embodiments, the forming of the '+'-shaped gate electrode may include sequentially forming a first photoresist layer and a second photoresist layer on the substrate provided with the source and drain electrodes, patterning the second photoresist layer to form a first opening, patterning the first photoresist layer to form a second opening under the first opening, the second opening having a width smaller than that of the first opening, forming a first conductive layer to fill the first and second openings, forming a second conductive layer on the first conductive layer to be overlapped with the first opening, in plan view, and removing the first and second photoresist layers.

In example embodiments, the second conductive layer may include at least one of nickel, gold, platinum, titanium, chromium, titanium/tungsten alloy, or platinum silicide.

In example embodiments, the first conductive layer may be formed to have a T-shaped section, and the second conductive layer may be formed to have a width that is smaller than that of the first opening and is greater than that of the second opening.

In example embodiments, the second conductive layer may be formed to have a triangular or rectangular section.

In example embodiments, the first conductive layer may be formed to have a Γ-shaped section, and the second conductive layer may include a third conductive layer provided on the first conductive layer and overlapped with the first opening, in plan view, and a fourth conductive layer covering the third and first conductive layers.

In example embodiments, the third conductive layer may be formed to have a width that is smaller than that of the first opening and is greater than that of the second opening.

In example embodiments, the third conductive layer may be formed to have a triangular or rectangular section.

In example embodiments, the fourth conductive layer extends from a top surface of the third conductive layer toward a portion of the first conductive layer filling a wider portion of the first opening.

In example embodiments, the first and second photoresist layers comprise polymethyl methacrylate.

In example embodiments, the second opening may be formed to have a width of 0.2 μm or less.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
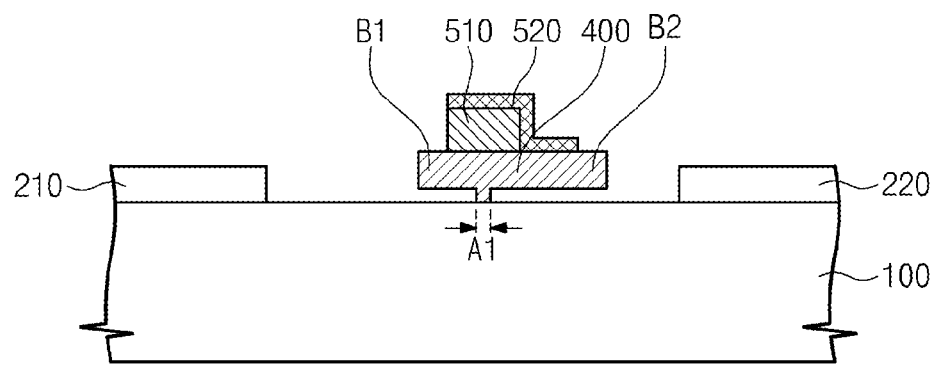
FIG. 1 is a sectional view illustrating a field effect transistor according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a field effect transistor according to example embodiments of the inventive concept.

Referring to FIG. 1, a field effect transistor may include a substrate 100, a source electrode 210, a drain electrode 220, and a '+'-shaped gate electrode.

The substrate 100 may include gallium arsenide (GaAs) or gallium nitride (GaN). The substrate 100 may include an insulating substrate and an epitaxial layer made of gallium arsenide or gallium nitride (not shown) thereon. Here, the insulating substrate may include silicon (Si), silicon carbide (SiC), or sapphire. In example embodiments, the insulating substrate may be doped with impurities.

The source and drain electrodes 210 and 220 may be provided, spaced apart from each other, on the epitaxial layer of the substrate 100. Each of the source and drain electrodes 210 and 220 may include a conductive material. For example, each of the source and drain electrodes 210 and 220 may include an alloy, which may be formed by performing a rapid thermal treatment to a stack of titanium/aluminum/nickel/gold.

The '+'-shaped gate electrode may be provided on a portion of the substrate 100 located between the source electrode 210 and the drain electrode 220. The '+'-shaped gate electrode may include a Γ-shaped gate electrode portion 400, a first additional gate electrode portion 510, and a second additional gate electrode portion 520.

The Γ-shaped gate electrode portion 400 may include a leg portion having a small width of A1 and a head portion asymmetrically provided on the leg portion to have a large width. In example embodiments, the leg portion of the Γ-shaped gate electrode portion 400 may have a width of 0.2 μm or less. The Γ-shaped gate electrode portion 400 may be formed of nickel/gold.

The first additional gate electrode portion 510 may be provided on the head portion of the Γ-shaped gate electrode portion 400, and thus, it may be overlapped with the leg portion of the Γ-shaped gate electrode portion 400. The first additional gate electrode portion 510 may include a material having low ductility and high strength. The first additional gate electrode portion 510 may include at least one of nickel (Ni), gold (Au), platinum (Pt), titanium (Ti), chromium (Cr), an titanium (Ti)/tungsten (W) alloy, or platinum silicide. The first additional gate electrode portion 510 may have a width that is greater than that of the leg portion of the Γ-shaped gate electrode portion 400 and is smaller than that of the head portion of the Γ-shaped gate electrode portion 400. The first additional gate electrode portion 510 may have a triangular or rectangular section.

The first additional gate electrode portion 510 may be configured to exert a tension to the Γ-shaped gate electrode portion 400, thereby preventing the Γ-shaped gate electrode portion 400 from being broken by unstable weight distribution or structural instability of the head portion. For example, the head portion may include a left portion B1 and a right portion B2 that are horizontally but asymmetrically extended from the leg portion, and therefore, the head portion may have structural instability.

The second additional gate electrode portion 520 may be provided to cover the first additional gate electrode portion 510 and the Γ-shaped gate electrode portion 400. The second additional gate electrode portion 520 may include a material having low ductility and high strength. The second additional gate electrode portion 520 may include at least one of nickel, gold, platinum, titanium, chromium, titanium/tungsten alloy, or platinum silicide. The second additional gate electrode portion 520 may extend from the top surface of the first additional gate electrode portion 510 to cover a wider portion (e.g., the right portion B2) of the head portion of the Γ-shaped gate electrode portion 400.

The second additional gate electrode portion 520 may be provided to compensate a difference in weight between the left portion B1 and the right portion B2 of the head portion of the Γ-shaped gate electrode portion 400. In other words, due to the presence of the second additional gate electrode portion 520, the '+'-shaped gate electrode may have a center of mass located on the leg portion, and this makes it possible to provide a tension capable of preventing the '+'-shaped gate electrode from being broken or falling by unstable weight distribution or structural instability of the head portion of the Γ-shaped gate electrode portion 400.

Figure 2:
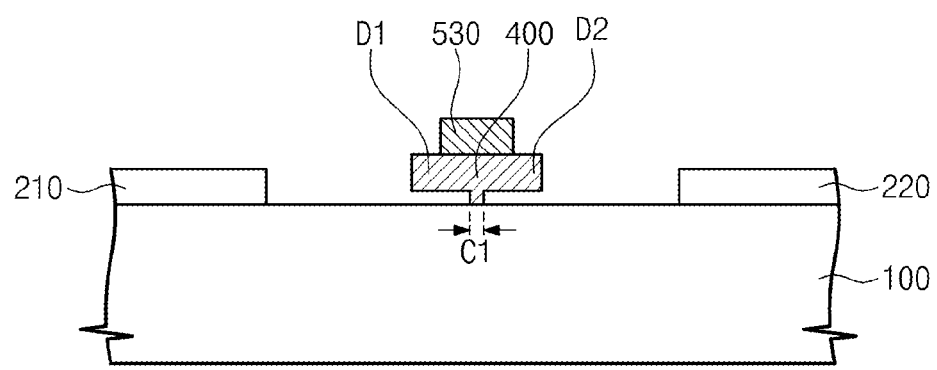
FIG. 2 is a sectional view illustrating a field effect transistor according to other example embodiments of the inventive concept.

Hereinafter, a field effect transistor according to other example embodiments of the inventive concept will be described with reference to FIG. 2. FIG. 2 is a sectional view illustrating a field effect transistor according to other example embodiments of the inventive concept. For concise description, a previously described element may be identified by a similar or identical reference number without repeating an overlapping description thereof.

Except for a structural difference of a gate electrode, the field effect transistor of FIG. 2 may be configured to have substantially the same technical features as those of the previous embodiments.

The '+'-shaped gate electrode may be provided on a portion of the substrate 100 located between the source electrode 210 and the drain electrode 220. The '+'-shaped gate electrode may include a T-shaped gate electrode portion 400 and an additional gate electrode portion 530.

The T-shaped gate electrode portion 400 may include a leg portion having a small width of C1 and a head portion symmetrically provided on the leg portion to have a large width. In example embodiments, the leg portion of the T-shaped gate electrode portion 400 may have a width of 0.2 μm or less.

The additional gate electrode portion 530 may be provided on the head portion of the T-shaped gate electrode portion 400, and thus, it may be overlapped with the leg portion of the T-shaped gate electrode portion 400. The additional gate electrode portion 530 may include a material having low ductility and high strength. For example, the additional gate electrode portion 530 may include at least one of nickel, gold, platinum, titanium, chromium, titanium/tungsten alloy, or platinum silicide. The additional gate electrode portion 530 may have a width that is greater than that of the leg portion of the T-shaped gate electrode portion 400 and is smaller than that of the head portion of the T-shaped gate electrode portion 400. The additional gate electrode portion 530 may have a triangular or rectangular section.

In example embodiments, the additional gate electrode portion 530 may be configured to reduce a difference in weight between a left portion D1 and a right portion D2 of the head portion. In other words, due to the presence of the additional gate electrode portion 530, the '+'-shaped gate electrode may have a center of mass located on the leg portion, and this makes it possible to provide a tension capable of preventing the '+'-shaped gate electrode from being broken or falling by unstable weight distribution or structural instability of the head portion.

According to example embodiments of the inventive concept, field effect transistors may include a '+'-shaped gate electrode, and thus, it is possible to prevent the gate electrode from being broken during or after its fabrication process. As a result, the field effect transistors can have improved reliability.

The field effect transistor have been described to have a Γ- or T-shaped gate electrode, but example embodiments of the inventive concept may not be limited thereto.

For example, in further embodiments of the inventive concept, the field effect transistor may be configured to have a 'Y'-shaped or mushroom-shaped gate electrode.

FIGS. 3A through 3F are sectional views illustrating a method of fabricating a field effect transistor, according to example embodiments of the inventive concept.

Figure 3A:
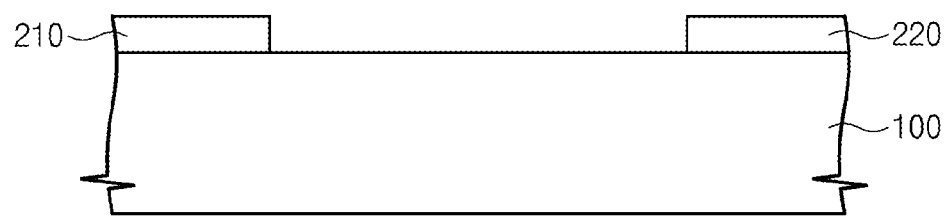
FIGS. 3A through 3F are sectional views illustrating a method of fabricating a field effect transistor, according to example embodiments of the inventive concept.

Referring to FIG. 3A, a source electrode 210 and a drain electrode 220 may be formed on a substrate 100 to be spaced apart from each other.

The substrate 100 may include gallium arsenide (GaAs) or gallium nitride (GaN). The substrate 100 may include an insulating substrate and an epitaxial layer made of gallium arsenide or gallium nitride (not shown) thereon. The insulating substrate may include silicon (Si), silicon carbide (SiC), or sapphire. Further, the insulating substrate may be doped with impurities.

The source and drain electrodes 210 and 220 may be formed to be spaced apart from each other on the epitaxial layer of the substrate 100. Each of the source and drain electrodes 210 and 220 may include a conductive material. For example, each of the source and drain electrodes 210 and 220 may include an alloy, which may be formed by performing a rapid thermal treatment to a stack of titanium/aluminum/nickel/gold.

Figure 3B:
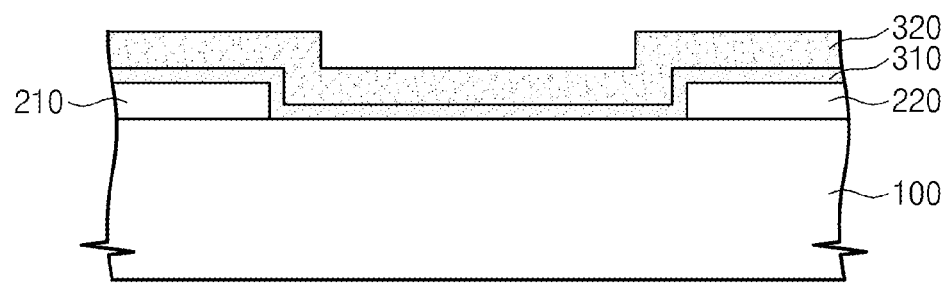

Referring to FIG. 3B, a first photoresist layer 310 and a second photoresist layer 320 may be sequentially formed on the whole top surface of the substrate 100 provided with the source and drain electrodes 210 and 220. Each of the first and second photoresist layers 310 and 320 may include polymethyl methacrylate (PMMA). The use of PMMA makes it possible to realize fine patterns.

Figure 3C:
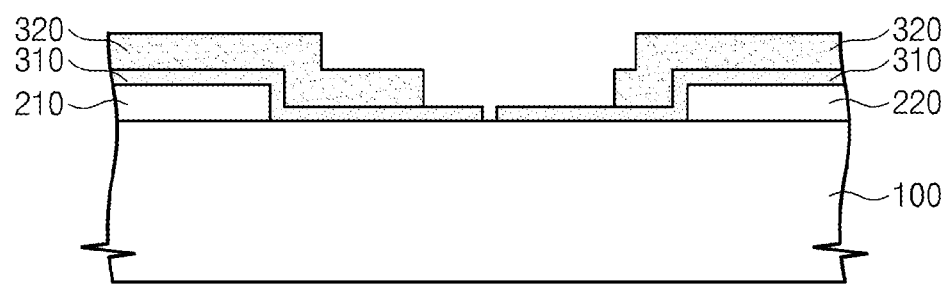

Referring to FIG. 3C, the second photoresist layer 320 may be patterned to form a first opening. The first opening may be used to define a head portion of a Γ-shaped gate electrode portion 400, which will be described with reference to FIG. 3D.

In example embodiments, the patterning of the first photoresist layer 310 may be performed to form a second opening under the first opening. The second opening may be formed to have a width smaller than that of the first opening. The second opening may be formed at a position that is deviated from a center of the first opening. The second opening may be used to define a leg portion of the Γ-shaped gate electrode portion 400. The second opening may be formed to have a width of about 0.2 μm or less.

Figure 3D:
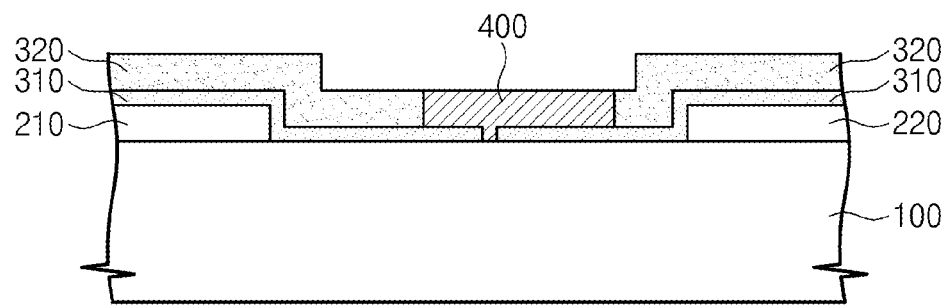

Referring to FIG. 3D, the Γ-shaped gate electrode portion 400 may be formed to fill the first and second openings. In example embodiments, the Γ-shaped gate electrode portion 400 may include a leg portion having a narrow width and a head portion asymmetrically provided on the leg portion to have a large width. The leg portion of the Γ-shaped gate electrode portion 400 may have a width of about 0.2 μm or less. The Γ-shaped gate electrode portion 400 may be formed of a double layer of nickel/gold.

Figure 3E:
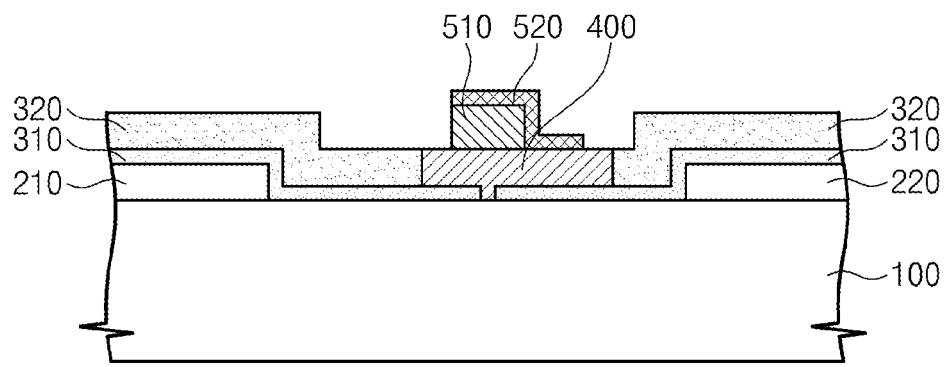

Referring to FIG. 3E, a first additional gate electrode portion 510 may be formed on the Γ-shaped gate electrode portion 400 to be overlapped with the second opening. The first additional gate electrode portion 510 may include a material having low ductility and high strength. For example, the first additional gate electrode portion 510 may include at least one of nickel, gold, platinum, titanium, chromium, titanium/tungsten alloy, or platinum silicide. The first additional gate electrode portion 510 may be formed to have a width that is greater than that of the leg portion of the Γ-shaped gate electrode portion 400 and is smaller than that of the head portion of the Γ-shaped gate electrode portion 400. The first additional gate electrode portion 510 may be formed to have a triangular or rectangular section.

A second additional gate electrode portion 520 may be formed to cover the first additional gate electrode portion 510 and the Γ-shaped gate electrode portion 400. The second additional gate electrode portion 520 may include a material having low ductility and high strength. For example, the second additional gate electrode portion 520 may include at least one of nickel, gold, platinum, titanium, chromium, titanium/tungsten alloy, or platinum silicide. The second additional gate electrode portion 520 may be formed to extend from the top surface of the first additional gate electrode portion 510 and cover a wider portion of the head portion of the Γ-shaped gate electrode portion 400.

Figure 3F:
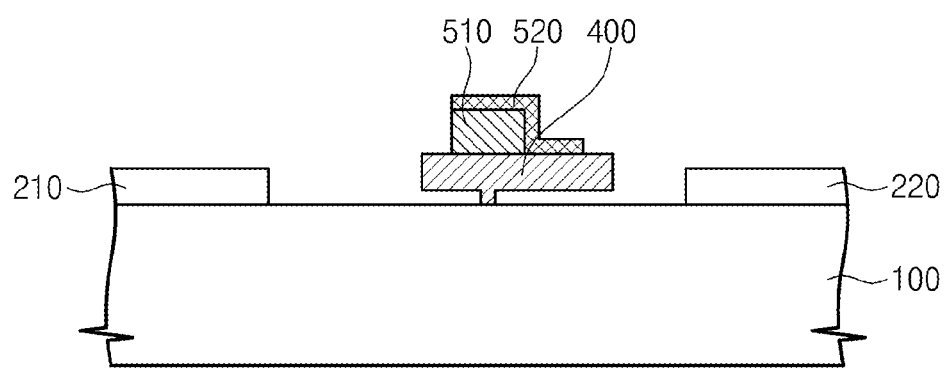

Referring to FIG. 3F, the first and second photoresist layers 310 and 320 may be removed to expose the source electrode 210 and the drain electrode 220.

the first additional gate electrode portion 510 may be configured to exert a tension to the Γ-shaped gate electrode portion 400, thereby preventing the Γ-shaped gate electrode portion 400 from being broken by unstable weight distribution or structural instability of the head portion of the Γ-shaped gate electrode portion 400.

The second additional gate electrode portion 520 may be provided to compensate a difference in weight between the left and right portions of the head portion asymmetrically protruding from the leg portion of the Γ-shaped gate electrode portion 400. In other words, due to the presence of the second additional gate electrode portion 520, the '+'-shaped gate electrode may have a center of mass located on the leg portion of the Γ-shaped gate electrode portion 400, and this makes it possible to provide a tension capable of preventing the '+'- shaped gate electrode from being broken or falling by unstable weight distribution or structural instability of the head portion of the Γ-shaped gate electrode portion 400.

Accordingly, it is possible to fabricate a field effect transistor with '+'-shaped gate electrode that is prevented from being broken or falling during or after its fabrication process.

Hereinafter, a method of fabricating a field effect transistor, according to other example embodiments of the inventive concept, will be described with reference to FIGS. 4A through 4F. FIGS. 4A through 4F are sectional views illustrating a method of fabricating a field effect transistor, according to other example embodiments of the inventive concept. For concise description, a previously described element may be identified by a similar or identical reference number without repeating an overlapping description thereof.

Except for a structural difference of a gate electrode, the fabricating method to be described with reference to FIGS. 4A through 4F may be configured to have substantially the same technical features as those of the previous embodiments.

Referring to FIGS. 4A through 4D, a source electrode 210 and a drain electrode 220 may be formed on the substrate 100 to be spaced apart from each other.

A first photoresist layer 310 and a second photoresist layer 320 may be sequentially formed on the whole top surface of the substrate 100 provided with the source and drain electrodes 210 and 220.

The second photoresist layer 320 may be patterned to form a first opening. The first opening may be used to define a head portion of a T-shaped gate electrode portion 400, which will be formed in a subsequent step.

The patterning of the first photoresist layer 310 may be performed to form a second opening under the first opening. The second opening may be formed to have a width smaller than that of the first opening. The second opening may be formed on a center of the first opening. The second opening may be used to define a leg portion of the T-shaped gate electrode portion 400. The second opening may be formed to have a width of about 0.2 μm or less.

A T-shaped gate electrode portion 400 may be formed to fill the first and second openings. The T-shaped gate electrode portion 400 may include a leg portion having a small width and a head portion symmetrically provided on the leg portion to have a large width. In example embodiments, the leg portion of the T-shaped gate electrode portion 400 may have a width of 0.2 μm or less.

Figure 4A:
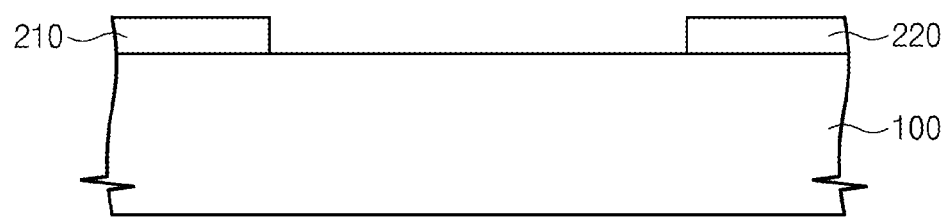
FIGS. 4A through 4F are sectional views illustrating a method of fabricating a field effect transistor, according to other example embodiments of the inventive concept.
Figure 4B:
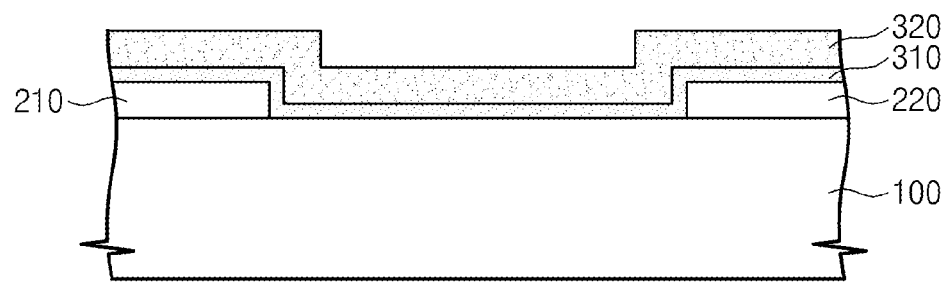
Figure 4C:
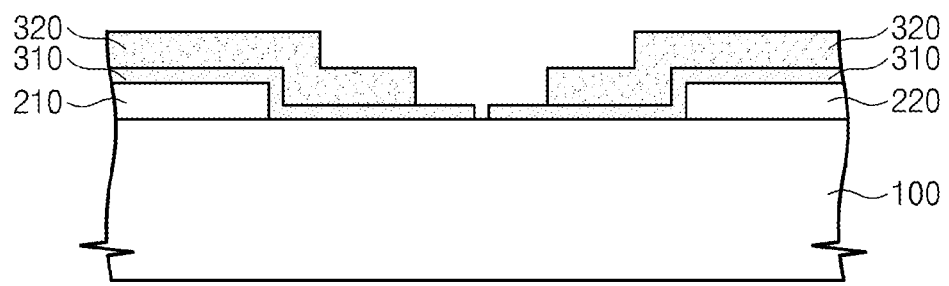
Figure 4D:
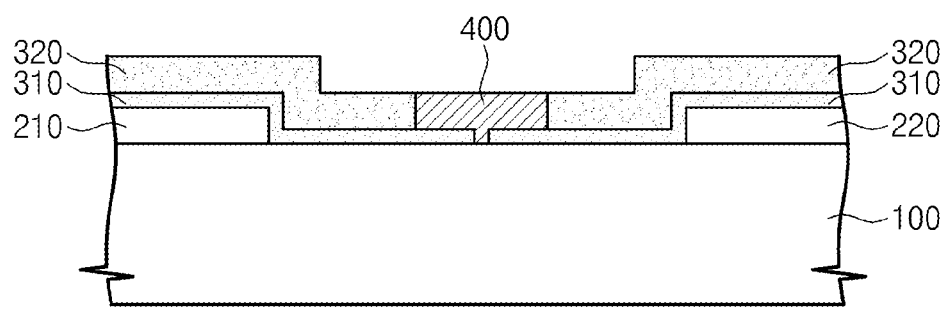
Figure 4E:
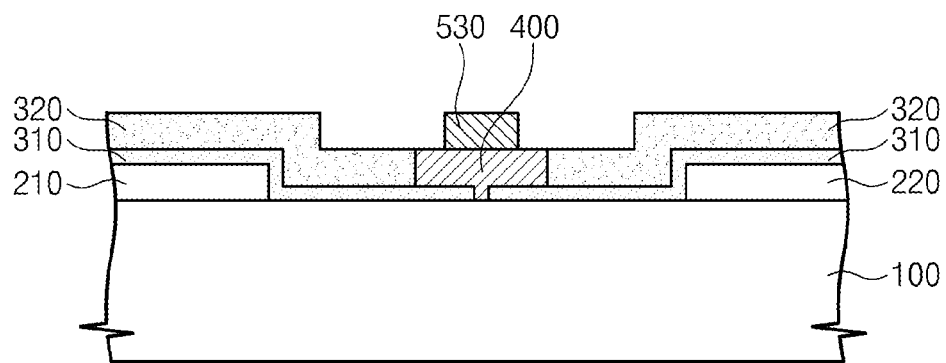
Figure 4F:
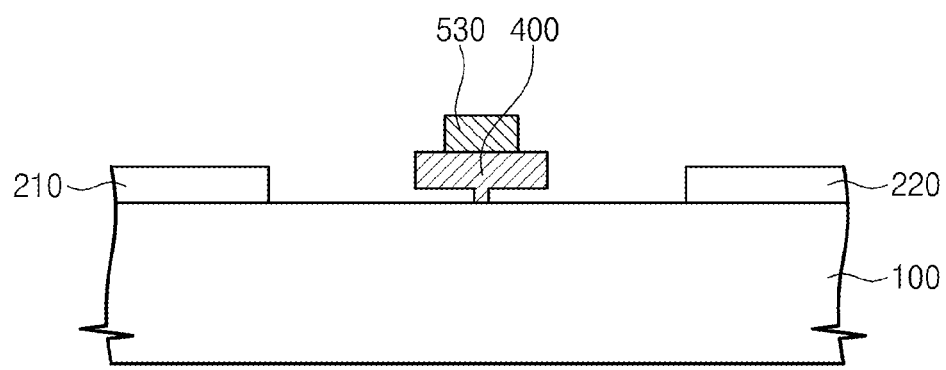

Referring to FIGS. 4E and 4F, an additional gate electrode portion 530 may be formed on the T-shaped gate electrode portion 400 to be overlapped with the second opening. The additional gate electrode portion 530 may include a material having low ductility and high strength. The additional gate electrode portion 530 may include at least one of nickel, gold, platinum, titanium, chromium, titanium/tungsten alloy, or platinum silicide. The additional gate electrode portion 530 may be formed to have a width that is greater than that of the leg portion of the T-shaped gate electrode portion 400 and is smaller than that of the head portion of the T-shaped gate electrode portion 400. The additional gate electrode portion 530 may be formed to have a triangular or rectangular section.

The first and second photoresist layers 310 and 320 may be removed to expose the source electrode 210 and the drain electrode 220.

The additional gate electrode portion 530 may be configured to reduce a difference in weight between left and right portions of the head portion horizontally protruding from the leg portion of the T-shaped gate electrode portion 400. In other words, due to the presence of the additional gate electrode portion 530, the '+'-shaped gate electrode may have a center of mass located on the leg portion, and this makes it possible to provide a tension capable of preventing the T-shaped gate electrode portion 400 from being broken or falling by unstable weight distribution or structural instability of the head portion.

Accordingly, it is possible to fabricate a field effect transistor with '+'-shaped gate electrode that is prevented from being broken or falling during or after its fabrication process.

According to example embodiments of the inventive concept, a method of fabricating a field effect transistor may include a step of forming a '+'-shaped gate electrode, and thus, it is possible to prevent the gate electrode from being broken during or after its forming step. As a result, it is possible to provide the field effect transistors with improved reliability.

According to example embodiments of the inventive concept, a field effect transistor may include a '+'-shaped gate electrode, and thus, it is possible to prevent the gate electrode from being broken during or after its fabrication process. Accordingly, it is possible to provide a field effect transistor with improved reliability and a method of fabricating the same.

While example embodiments of the inventive concepts have been particularly shown and described, it will be understood by one of ordinary skill in the art that variations in form and detail may be made therein without departing from the spirit and scope of the attached claims.

What is claimed is:

1. A field effect transistor, comprising:
   a source electrode and a drain electrode provided spaced apart from each other on a substrate; and
   a '+'-shaped gate electrode provided on a portion of the substrate located between the source and drain electrodes,
   wherein the '+'-shaped gate electrode comprises:
   a T-shaped gate electrode portion; and
   an additional gate electrode portion provided on the T-shaped gate electrode portion,
   wherein:
   the additional gate electrode portion is provided on a head portion of the T-shaped gate electrode portion in such a way that it is overlapped with a leg portion of the T-shaped gate electrode portion in plan view;
   the additional gate electrode portion has a width that is greater than that of the leg portion of the T-shaped gate electrode portion;
   the additional gate electrode portion comprises at least one of nickel, gold, platinum, titanium, chromium, titanium/tungsten alloy, or platinum silicide; and
   a lower surface of the head portion and a sidewall of the leg portion are exposed to an outside, forming an empty space defined collectively by the lower surface of the head portion, the sidewall of the leg portion and the substrate.

2. The field effect transistor of claim 1, wherein the additional gate electrode portion has a triangular or rectangular section.

3. A field effect transistor, comprising:
   a source electrode and a drain electrode provided spaced apart from each other on a substrate; and
   a '+'-shaped gate electrode provided on a portion of the substrate located between the source and drain electrodes,
   wherein the '+'-shaped gate electrode comprises:
   a Γ-shaped gate electrode portion;

a first additional gate electrode portion provided on the Γ-shaped gate electrode portion; and a second additional gate electrode portion covering the first additional gate electrode portion and the Γ-shaped gate electrode portion.

4. The field effect transistor of claim 3, wherein the first additional gate electrode portion is provided on a head portion of the Γ-shaped gate electrode portion in such a way that it is overlapped with a leg portion of the Γ-shaped gate electrode portion in plan view, and wherein the first additional gate electrode portion has a width that is greater than that of the leg portion of the Γ-shaped gate electrode portion and is smaller than that of the head portion of the Γ-shaped gate electrode portion.

5. The field effect transistor of claim 3, wherein the first additional gate electrode portion has a triangular or rectangular section.

6. The field effect transistor of claim 3, wherein the second additional gate electrode portion extends from a top surface of the first additional gate electrode portion toward a wider protrusion of the head portion of the Γ-shaped gate electrode portion.

7. The field effect transistor of claim 3, wherein each of the first and second additional gate electrode portions comprises at least one of nickel, gold, platinum, titanium, chromium, titanium/tungsten alloy, or platinum silicide.

8. A method of fabricating a field effect transistor, comprising:

forming a source electrode and a drain electrode on a substrate to be spaced apart from each other; and forming a '+'-shaped gate electrode on a portion of the substrate located between the source and drain electrodes, wherein the '+'-shaped gate electrode comprises:

a T-shaped gate electrode portion; and an additional gate electrode portion provided on the T-shaped gate electrode portion, wherein the additional gate electrode portion is provided on a head portion of the T-shaped gate electrode portion in such a way that it is overlapped with a leg portion of the T-shaped gate electrode portion in plan view, wherein the additional gate electrode portion has a width that is greater than that of the leg portion of the T-shaped gate electrode portion, and wherein:

the additional gate electrode portion comprises at least one of nickel, gold, platinum, titanium, chromium, titanium/tungsten alloy, or platinum silicide; and a lower surface of the head portion and a sidewall of the leg portion are exposed to an outside, forming an empty space defined collectively by the lower surface of the head portion, the sidewall of the leg portion and the substrate.

9. The method of claim 8, wherein the forming of the '+'-shaped gate electrode comprises:

sequentially forming a first photoresist layer and a second photoresist layer on the substrate provided with the source and drain electrodes;

patterning the second photoresist layer to form a first opening;

patterning the first photoresist layer to form a second opening under the first opening, the second opening having a width smaller than that of the first opening;

forming a first conductive layer to fill the first and second openings;

forming a second conductive layer on the first conductive layer to be overlapped with the first opening, in plan view; and removing the first and second photoresist layers.

10. The method of claim 9, wherein the second conductive layer comprises at least one of nickel, gold, platinum, titanium, chromium, titanium/tungsten alloy, or platinum silicide.

11. The method of claim 9, wherein the first conductive layer is formed to have a T-shaped section, and wherein the second conductive layer is formed to have a width that is smaller than that of the first opening and is greater than that of the second opening.

12. The method of claim 11, wherein the second conductive layer is formed to have a triangular or rectangular section.

13. A method of fabricating a field effect transistor, comprising:

forming a source electrode and a drain electrode on a substrate to be spaced apart from each other; and forming a '+'-shaped gate electrode on a portion of the substrate located between the source and drain electrodes, wherein the '+'-shaped gate electrode comprises:

a Γ-shaped gate electrode portion; and a first additional gate electrode portion provided on the Γ-shaped gate electrode portion, wherein the forming of the '+'-shaped gate electrode comprises:

sequentially forming a first photoresist layer and a second photoresist layer on the substrate provided with the source and drain electrodes;

patterning the second photoresist layer to form a first opening;

patterning the first photoresist layer to form a second opening under the first opening, the second opening having a width smaller than that of the first opening;

forming a first conductive layer to fill the first and second openings;

forming a second conductive layer on the first conductive layer to be overlapped with the first opening, in plan view; and removing the first and second photoresist layers, wherein the first conductive layer is formed to have a Γ-shaped section, and the second conductive layer comprises:

a third conductive layer provided on the first conductive layer and overlapped with the first opening, in plan view; and a fourth conductive layer covering the third and first conductive layers.

14. The method of claim 13, wherein the third conductive layer is formed to have a width that is smaller than that of the first opening and is greater than that of the second opening.

15. The method of claim 13, wherein the third conductive layer is formed to have a triangular or rectangular section.

16. The method of claim 13, wherein the fourth conductive layer extends from a top surface of the third conductive layer toward a portion of the first conductive layer filling a wider portion of the first opening.

17. The method of claim 8, wherein the second opening is formed to have a width of 0.2 μm or less.

18. A field effect transistor, comprising:

a source electrode and a drain electrode provided spaced apart from each other on a substrate; and a '+'-shaped gate electrode provided on a portion of the substrate located between the source and drain electrodes, wherein the '+'-shaped gate electrode comprises:
a Γ-shaped gate electrode portion; and
a first additional gate electrode portion provided on the Γ-shaped gate electrode portion.

* * * * *